United States Patent [19]

Orillion

[11] 4,398,053
[45] * Aug. 9, 1983

[54] PYRAMIDAL ENERGY COLLECTOR

[76] Inventor: Alfred G. Orillion, 1201-E Cleermont Cir., Huntsville, Ala. 35801

[ * ] Notice: The portion of the term of this patent subsequent to Jan. 2, 1996, has been disclaimed.

[21] Appl. No.: 233,040

[22] Filed: Feb. 9, 1981

Related U.S. Application Data

[63] Continuation-in-part of Ser. No. 972,893, Dec. 26, 1978, Pat. No. 4,249,520, which is a continuation-in-part of Ser. No. 800,745, May 26, 1977, Pat. No. 4,132,221.

[51] Int. Cl.$^3$ .......................... H01L 31/04; F24J 3/02
[52] U.S. Cl. .................................... 136/248; 136/246; 126/439; 126/450
[58] Field of Search ................ 136/246, 248; 126/439, 126/450

[56] References Cited

U.S. PATENT DOCUMENTS

| | | | |
|---|---|---|---|
| 4,132,221 | 1/1979 | Orillion | 126/439 |
| 4,187,123 | 2/1980 | Diggs | 136/206 |
| 4,249,520 | 2/1981 | Orillion | 126/439 |

*Primary Examiner*—Aaron Weisstuch
*Attorney, Agent, or Firm*—C. A. Phillips

[57] ABSTRACT

A radiation energy collector system in which an energy absorber is positioned within a pyramidal enclosure of which approximately one-half of the side area is radiation energy transmissive, and the other side and base area having a reflective inner surface, whereby radiation energy passing through the transmissive side area in part directly impinges on the absorber, and in part is reflected onto the absorber.

8 Claims, 6 Drawing Figures

PYRAMIDAL ENERGY COLLECTOR

This is a continuation-in-part of application Ser. No. 972,893, filed Dec. 26, 1978, entitled "Pyramidal Energy Collector System," now U.S. Pat. No. 4,249,520, which is a continuation-in-part of application Ser. No. 800,745, filed May 26, 1977, now U.S. Pat. No. 4,132,221.

BACKGROUND OF THE INVENTION

1. Field of the Invention

This invention relates to solar energy collecting systems, and particularly to a new combination of an enclosure and an absorber or collector.

2. General Description of the Prior Art

In the past few years, and even before, many configurations of solar energy collectors have been proposed and some of them marketed. The principal problem today with solar energy collectors, either for heat or for electricity conversion, is, as with most products, that of providing an acceptable balance between cost, effectiveness, and durability. The fact that no single configuration has really captured the market is an indication that optimum designs are yet to appear. Considering the known types, perhaps the most common are for heat collection is the flat plate collector wherein a dark colored heat receiver is encased within an enclosure having a transparent or translucent face through which solar radiation directly impinges on the receiver and having a bottom side which is heavily insulated. Typically, the receiver contains a passageway or passageways through which a liquid, to be heated, is circulated. Depending upon the material through which the receiver is constructed, and thereby often its durability, a flat plate-collector costs in the vicinity of $8.00 to $14.00 per square foot of active surface, with typical installation costs for a domestic hot water heater system running $800.00 to $2,000.00. This high cost is in part because of a typical requirement that there be a liquid-to-liquid heat exchanger to heat potable water and the use of a special fluid which flows between the heat receiver and the heat exchanger in order to avoid freezing or corrosion and deposits on the passageways of the heat receiver, which would render the receiver inoperative or ineffective after a relatively short period (in terms of the typical and expected life of a heating system, or even a hot water system, of 5 to 15 years). For electricity conversion, perhaps the most common one is a flat plate module arrangement of a number of photoelectric or photovoltaic cells, or solar cells (terms used interchangeably), encased within an enclosure having a transparent cover through which sunlight passes and impinged directly onto the solar cells. Typically, each solar cell is connected to electrical conductors which are brought to terminal connectors from which the electrical power may be taken. These flat plate solar cell modules, or photovoltaic arrays, are constructed such that the heat from the photoelectric cells may be removed from the back sides, which are away from the sun, to keep the solar cells within the desired operating temperature range. Typically, a number of these modules are electrically connected together, as a photovoltaic system operational arrangement, to get the desired power at a desired voltage level. Currently, the cost of electricity using such module array is from $7.00 to $18.00 per watt. This high cost is due primarily to the expensive manufacturing processes to produce the photosensitive semi-conductor material for the solar cell. The delicate photoelectric cell semi-circular must be protected from the effects of the environment to which it is exposed. A thin transparent covering is usually required to protect the solar cell surface from handling during manufacturing and assembly; beyond this, the amount of protective covering depends on the planned application. For space applications, sufficient covering must be used to protect the surface of the solar cells from micrometeorites; generally glass is used as the protective covering to minimize optical degradation from ultraviolet radiation. For terrestrial applications, the environment is more harsh due to dust, rain, hail and other projectiles; glass is likewise preferred, but it is expensive and susceptible to breakage from impacts and thermal stresses. Polymer coverings are less expensive than glass and are more flexible but degrade in time due to ultraviolet radiation effects. A technique to reduce the cost and provide some protection to the solar cells is to utilize a photovoltaic system in conjunction with an enclosed concentrator device. For terrestrial applications, one such device is a linear trough-like arrangement in which the solar cells are located at the bottom with the sun-sensitive surface facing up toward the top of the trough, which is covered with a transparent material, such as glass. The sides slope up and outward to the top and are covered inside with a reflective material. In such an arrangement, the solar cells can be covered with a thin layer of glass at the trough top transparent covering protects them from the external environment. A portion of the sunlight entering the trough would strike the solar cells directly, and most of the remainder would strike the reflective inner sides and, in turn, be reflected and concentrated down onto the solar cells. Within limits, photoelectric cells power output is proportional to the amount of light striking it. Consequently, concentrators take advantage of this phenomenon, getting more power out of the solar cells than that obtainable if the solar cells were in the usual flat plate arrangement.

In an effort to solve some of the foregoing problems in collecting solar energy to heat water and to directly convert to electricity, some design improvements and research have been made. As an example, heretofore, it has been proposed that where the object is to heat water, a potable hot water tank itself be encased in a heat receiving enclosure, and that in addition to utilizing direct radiation from the sun, some reflected radiation be captured and furnished to the tank. One such system is illustrated in the September 1976 issue of "Popular Science" magazine, starting on page 101. This system employs an elongated tank in an enclosure with an elongated front and with two of the sides forming a light transmissive trapezoid. The back side, with a reflective inner surface, is parallel to the front side, and the top and bottom sides are perpendicular to the plane of the other sides and are heavily insulated. A difficulty with this configuration is that for optimum performance, it must be adjusted in attitude for the latitude of the location and as a function of the altitude (varying with seasons) of the sun. Preferably, some azimuth changes should be made through the day, i.e., tracking of the sun, for best solar energy capture.

To achieve direct conversion of sunlight into electricity utilizing photoelectric cells, or solar cells, much research and development work has been done and is still being sponsored by the U. S. Department of Energy (DOE). The current mainstream effort by DOE is centered around their "Low-Cost Silicon Solar Array" (LSSA) Project. The prime emphasis of the LSSA Project is to develop low-cost silicon semi-conductor photoelectric cells and to assemble the cells into low-cost modules, each having a power output of approximately 10 to 15 watts. DOE is also doing some research and development work on photovoltaic solar concentrators.

Considering the foregoing, it is an object of this invention to overcome the stated problems, and particularly to provide an effective solar energy collector which may be used to directly heat potable water and/or to provide an efficient photovoltaic system that is long-lasting, and is of a configuration which provides a substantial measure of angular compensation, enabling it to be constructed with a fixed orientation, and yet be of improved effectiveness despite significant variations in both azimuth and altitude (seasons and latitude) of the sun.

SUMMARY OF THE INVENTION

In accordance with this invention, an absorber is positioned in a pyramidal structure wherein the floor of the structure is made radiation energy reflective, and the upper region of the structure is divided between a side region, extending part way around, which has a radiation reflective characteristic and a side region which is radiation energy transmissive. Solar radiation would pass through the radiation transmissive portion of the structure and a portion directly strike the absorber and the balance significantly reflected onto the absorber.

DETAILED DESCRIPTION OF THE DRAWINGS

Figure 1:
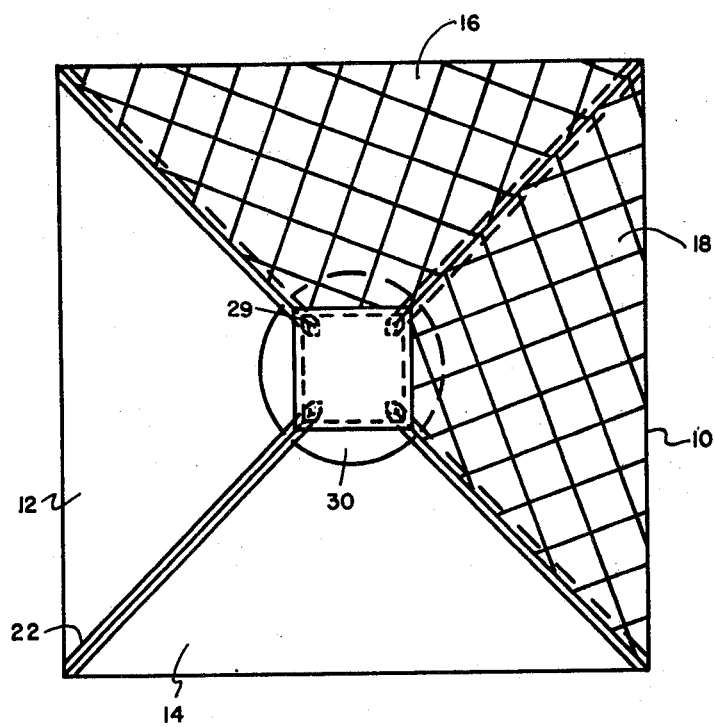
FIG. 1 is a plan view of an embodiment of this invention.
Figure 2:
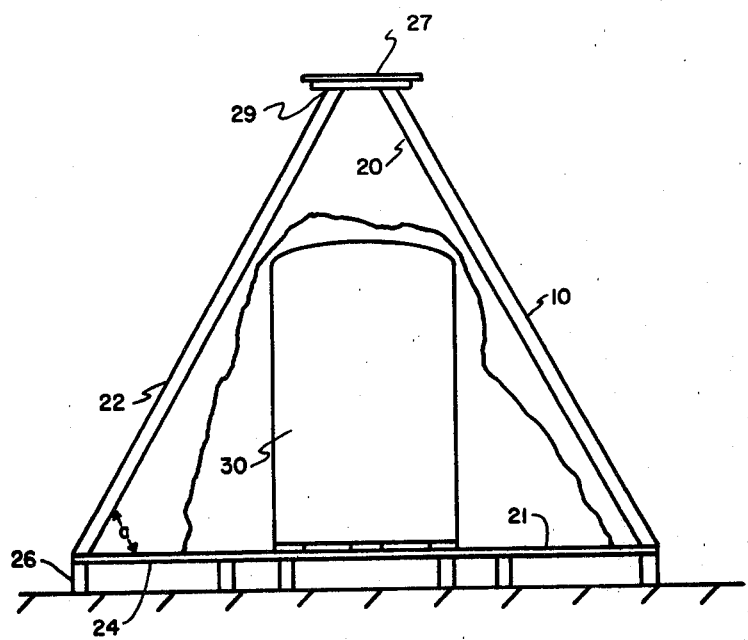
FIG. 2 is an elevational view with a portion of the side wall cut away to illustrate the interior arrangement.

Referring initially to FIGS. 1 and 2, a pyramidal enclosure 10 is constructed wherein triangular panels 12 and 14 are light transmissive, and triangular panels 16 and 19 are opaque and constructed with an interior reflective surface 20. Additionally, the surface 21 of base 24 is reflective. The angle "a" (measured vertically from the horizontal) for the panels would be in the range of 40° to 80°. The panels are supported on frame members 22 which are supported at their bottom by base 24, typically of plywood, this base then being supported by pillars or elongated planks 26. The tops 29 of frame members 22 are connected, by means not shown, to a flat rain cap or plate 27 which additionally functions to generally prevent leakage at the point of connection of the panels at the top. As a typical illustration, the base of each wall panel would be approximately 64 inches, and the height of the unit would be approximately 50 inches with flat rain cap 27, and 56 inches without rain cap 27. Alternately, the whole upper structure may be formed of one piece. In the center of enclosure 10 is positioned an energy absorber, such as a water tank 30, typically holding approximately 48 gallons, and having a diameter of 20 inches and a height of 32 inches. With this configuration, the tank extends upward a generally maximum amount within the enclosure, that is, to a point where there is a small clearance between the top of the tank and closest engagement to side wall panels. For purposes of interpretation, the term tank implies a single vessel of any shape, e.g., a cylinder or sphere, or a cluster of vessels that are interconnected, or a spiral of tubing; all configured to contain a fluid or allow passage thereof.

Wall panels of the reflective portion of the enclosure, panels 16 and 18, would typically be constructed of wood, metal, fiberglass, or a plastic material, with reflective surfaces 20 and 21 being a reflective coated plastic, such as aluminized mylar, or of reflective aluminum foil. Light transmission panels 12 and 14 are typically formed of a transparent or translucent material, such as plastic or glass. Top rain cap 27 may simply be of wood, plastic, or metal construction and may alternately embody or support a cupola which would have thermostatically controlled vents to enable excess heat in the enclosure to be discharged, if such should occur. Alternately, in order to effect safe operating conditions when the absorber is a tank to heat water, a pressure relief valve may be connected to tank 30 which would simply open and discharge any unsafe pressure condition arising from too high a temperature in the enclosure and causing steam to be formed.

Figure 3:
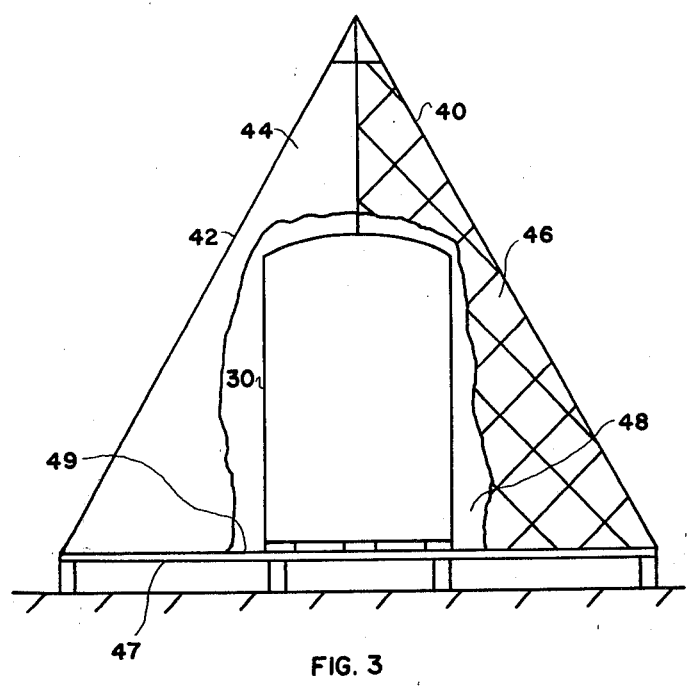
FIG. 3 is an elevational view of an alternate form of this invention wherein the upper enclosure is formed of one piece and the absorber protrudes through the base.

FIG. 3 illustrates a modified form of conical or pyramidal enclosure 40 wherein the upper structure is formed of one piece of light transmissive material. One-half of the side walls, the front half 42, as shown, would be of light transmissive material 44, and the other half, the back half 46 being opaque as a result of having an inner reflective surface 48. The inside of base 47 would have an inner reflective surface 49. Enclosure 40 is mounted on a roof 41, and tank 43 is formed of spiralled tubing 43a which extends into building 41a where it is supported on a base 45.

Figure 4:
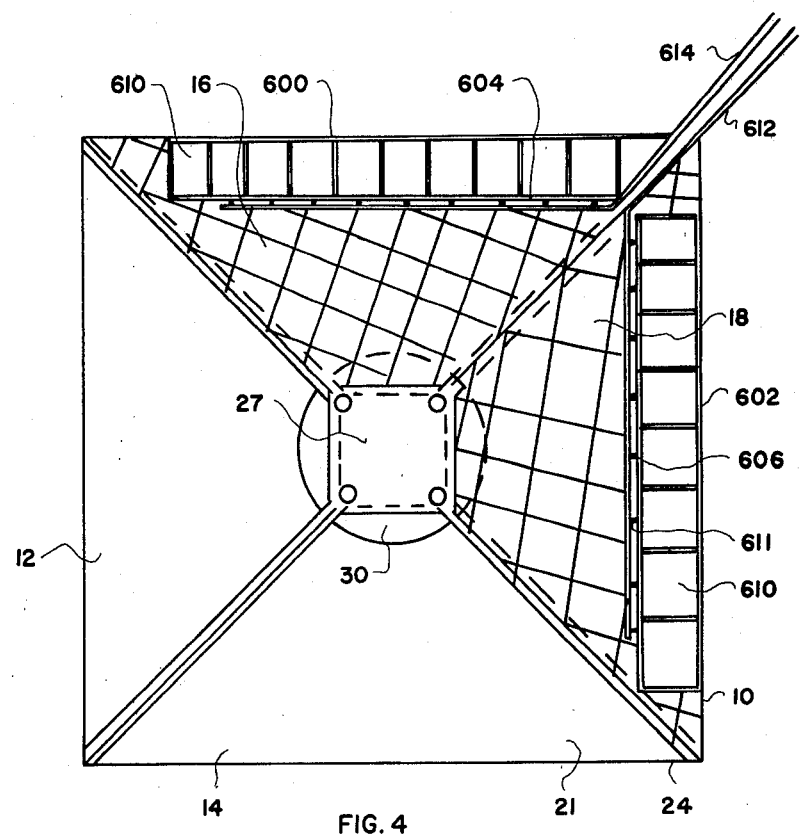
FIG. 4 is a plan view of an embodiment of the invention adapted to generate electricity.

Referring now to FIG. 4, the energy absorbers within enclosure 10 include a tank 30, including tubing 43, as shown in FIG. 3, and additionally, photocell (photovoltaic) panels 600 and 602, each comprising a row of photocells 610 that are positioned along along triangular wall panels 16 and 18, respectively. The photocell panels 600 and 602 are placed between the base 24 of enclosure 10 and raised edges 604 and 606 of triangular panels 16 and 18, respectively, and these photocell panels lie in the same plane as their respective triangular panels. Thus, in this arrangement, the light sensitive sides of photocells 610 face the inside of enclosure 10, and the back sides of photocells 610 are exposed outside of enclosure 10 to enable outside emission of heat typically developed in the cells. As shown, photocell panels 600 and 602 run the length of triangular panels 16 and 18, respectively, and typically, the panels would comprise individual photocells of selected sizes, or groups of photocells so arranged, to make up a height dimension of from $\frac{1}{8}$ to $\frac{1}{3}$ of the vertical distance from base 24 to cap 27.

Enclosure 10 would be oriented toward the sun such that sunlight would enter transparent sides 12 and 14, and a portion of entering sunlight would directly impinge on tank 30 and photocells 610. Significantly, a portion of the sunlight would initially strike either the inner surface 21 of base 24 or the reflective inner surfaces of side panels 16 and 18 and then be reflected between them one or more times, and then strike tank 30 and/or photocells 610. The transparent or light transmissive sides 12 and 14 of enclosure 10 may be of a transparent material, or these sides may be entirely open. Another alternative is to employ a screen material or hardware cloth to prevent objects from entering enclosure 10.

Figure 5:
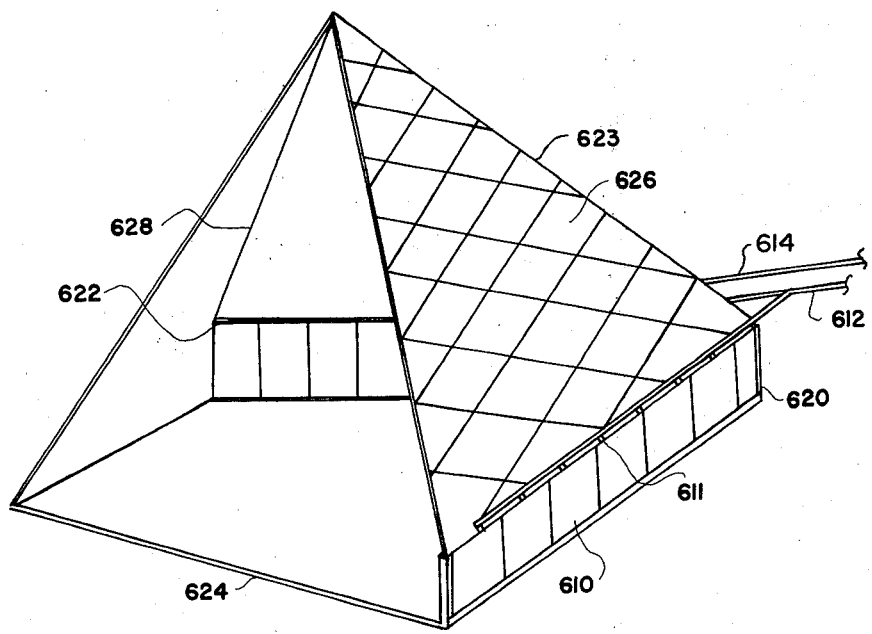
FIG. 5 is a pictorial view of an alternate configuration to that shown in FIG. 4.

FIG. 5 illustrates a modification of the enclosure shown in FIG. 4 wherein tank, or coil of tubing, 30 is omitted, and rows or panels of solar cells 620 and 622 of an enclosure 623 are arranged vertically with respect to horizontal base 624. This effects some improvement in operation, particularly with low sun angles. As in the case of the embodiment shown in FIG. 4, the base 624 and side regions 626 and 628 have inner reflective surfaces. Power from the photocells is taken out by means of wires 611 into cables 612 and 614.

Figure 6:
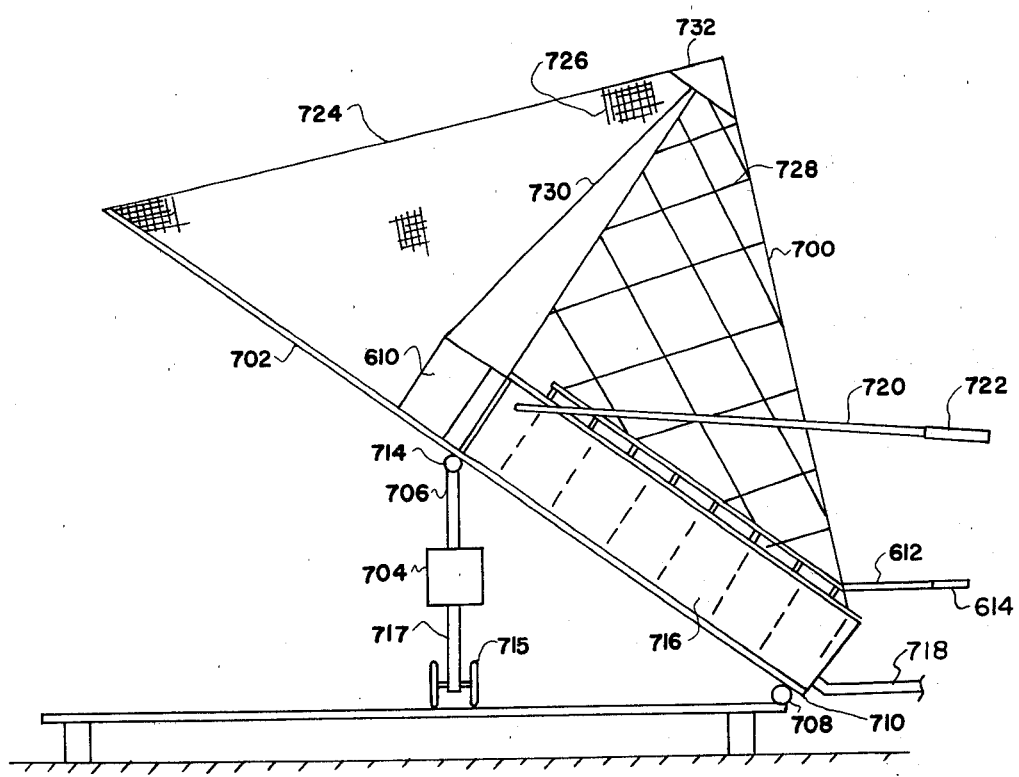
FIG. 6 is an elevational view of an alternate embodiment of the invention, wherein the electrical generating elements are liquid cooled, and means are provided to effect angular adjustment of the pyramidal structure with respect to its base.

FIG. 6 illustrates a modification of the enclosure shown in FIG. 4 to accommodate two additional features. One of them is the inclusion of means for elevating enclosure 700 with respect to base 702. Here, a conventional hydraulic or mechanical jack 704 positioned on rod 706 is employed to adjustably vary the elevation angle of orientation of enclosure 700 about pivot 708 at corner 710 with respect to platform 712 and hinge 714 connected to the underside of base 702 and rod 706. This arrangement is sometimes desirable in order to accommodate different sun elevations occurring during different times of the year. Azimuth orientation is accomplished by means of wheels 715 connected to strut 717 and resting upon platform 712 with rotation about pivot 708. As a second feature, enclosure 700 includes a liquid jacket type heat exchanger 716 positioned around the back side of photocells 610. It is supplied a circulating liquid through inlet pipes 718 and outlet pipes 720 and 722, in turn connected to a liquid-to-air heat exchanger (not shown). By this arrangement, the photocells may typically be operated in a lower temperature range than might be otherwise possible where utilizing only direct heat emission from the photocells. Also shown in FIG. 6 is an arrangement in which transparent side 724 is covered with a wire mesh, or screen, 726 that is connected to base 702 and sides 728 and 730 with a cap 732 to restrain the screen and sides.

I claim:
1. An energy collector comprising:
   a base and a generally pyramidal-shaped structure extending around and upward from said base;
   an opaque wall region of said pyramidal shaped structure extending approximately one-half way around said base, and said wall region extending upward linearly at an angle of less than 90° with respect to said base;
   said base and said wall region each having a radiant energy reflective inner surface, and approximately the remainder of said pyramidal shaped structure being radiant energy transmissive; and
   an energy absorber comprising photovoltaic cells extending around and forming a lower portion of said wall region, said photovoltaic cells being positioned and configured to:
      directly receive a portion of the radiation passing through the transmissive remainder of said structure,
      receive some radiation via a path through said transmissive remainder onto said reflective inner surface of said pyramidal structure and then reflected onto said photovoltaic cells,
      receive some radiation via a path through said transmissive remainder of said structure onto said reflective inner surface of said base and then reflected onto said photovoltaic cells, and
      to receive some radiation via a path through said transmissive remainder of said pyramidal-shaped structure that includes both said reflective inner surface of said base and said reflective inner surface of said pyramidal-shaped structure;
   whereby a substantial amount of all of the radiant energy passing through said transmissive remainder of said structure is captured by said photovoltaic cells, thereby, providing enhanced levels of radiation to said cells.

2. An energy collector as set forth in claim 1 including a liquid tank positioned on and rising from the central region of said base by which the liquid is heated in addition to the generation of electrical power.

3. An energy collector as set forth in claim 2 wherein said tank comprises a circular spiral of tubing.

4. An energy collector as set forth in claim 1 wherein said wall region extends pyramidal-shaped from said base.

5. An energy collector as set forth in claim 1 wherein said row of photovoltaic cells extends parallel with the elevational dimension of said pyramidal-shaped structure, and said wall region extends from an upper row edge of said photovoltaic cells.

6. An energy collector as set forth in claim 5 wherein the height of said photovoltaic cells extends from said base ⅛ to ⅓ the distance between said base and the top of said structure.

7. An energy collector as set forth in claim 1 further comprising a liquid type heat exchanger extending around and in engagement with a back side of said photovoltaic cells, whereby heat occurring in said photovoltaic cells is dissipated.

8. An energy collector as set forth in claim 1 further comprising means for adjustably elevating said wall structure with respect to a pivot point adjacent said base approximately one-half way around said wall region, whereby the radiation angle of said structure with respect to the sun may be adjusted.

* * * * *